United States Patent
Ng

(10) Patent No.: US 7,181,650 B2
(45) Date of Patent: Feb. 20, 2007

(54) FAULT TOLERANT DATA STORAGE CIRCUIT

(75) Inventor: Philip S. Ng, Cupertino, CA (US)

(73) Assignee: Atmel Corporation, San Jose, CA (US)

( * ) Notice: Subject to any disclaimer, the term of this patent is extended or adjusted under 35 U.S.C. 154(b) by 428 days.

(21) Appl. No.: 10/453,160

(22) Filed: Jun. 2, 2003

(65) Prior Publication Data

US 2004/0255196 A1 Dec. 16, 2004

(51) Int. Cl.
*G06F 11/00* (2006.01)
(52) U.S. Cl. .......................... 714/36; 714/724
(58) Field of Classification Search ............... 714/36, 714/30, 724, 734
See application file for complete search history.

(56) References Cited

U.S. PATENT DOCUMENTS

| | | | |
|---|---|---|---|
| 4,396,996 A | | 8/1983 | Oldham |
| 5,572,620 A | * | 11/1996 | Reilly et al. .................... 714/11 |
| 5,799,022 A | * | 8/1998 | Williams ..................... 714/797 |
| 5,923,512 A | * | 7/1999 | Brownlow et al. ............ 361/78 |
| 5,993,055 A | * | 11/1999 | Williams ..................... 714/732 |
| 6,104,211 A | * | 8/2000 | Alfke ........................... 326/91 |
| 6,144,604 A | * | 11/2000 | Haller et al. ................ 365/221 |
| 6,289,477 B1 | * | 9/2001 | Gunadisastra ............... 714/724 |
| 6,359,477 B1 | * | 3/2002 | Pathak ....................... 327/112 |
| 6,446,229 B1 | * | 9/2002 | Merrick et al. ............. 714/724 |
| 6,484,271 B1 | * | 11/2002 | Gray ............................... 714/6 |
| 2002/0180500 A1 | * | 12/2002 | Okuda et al. ................ 327/158 |

FOREIGN PATENT DOCUMENTS

JP 57098197 6/1982

OTHER PUBLICATIONS

Cioaca et al., "A Million-Cycle CMOS 256K EEPROM", IEEE Journal of Solid-State Circuits, vol., SC-22, No. 5, Oct. 1, 1987, pp. 684-692.

* cited by examiner

*Primary Examiner*—Dieu-Minh Le
(74) *Attorney, Agent, or Firm*—Schneck & Schneck; Thomas Schneck

(57) ABSTRACT

A fault tolerant data storage circuit for an integrated circuit produces a specified initial output state with high probability even in the presence of abnormal start-up conditions affecting one or more signal inputs to the storage circuit. The storage circuit includes a plurality of storage elements, such as flip-flops, latches, or static RAM cells, each acting as a redundant element for the others. The storage elements are constructed to normally assume a preferred initial state. All storage elements are clocked by a common clock line and loaded at their data inputs from a common data input line of the storage circuit. A logic gate, such as an AND gate combines the storage element outputs and outputs the correct initial state, unless all storage elements happen to be in the wrong state, which is an extremely low probability event.

6 Claims, 1 Drawing Sheet

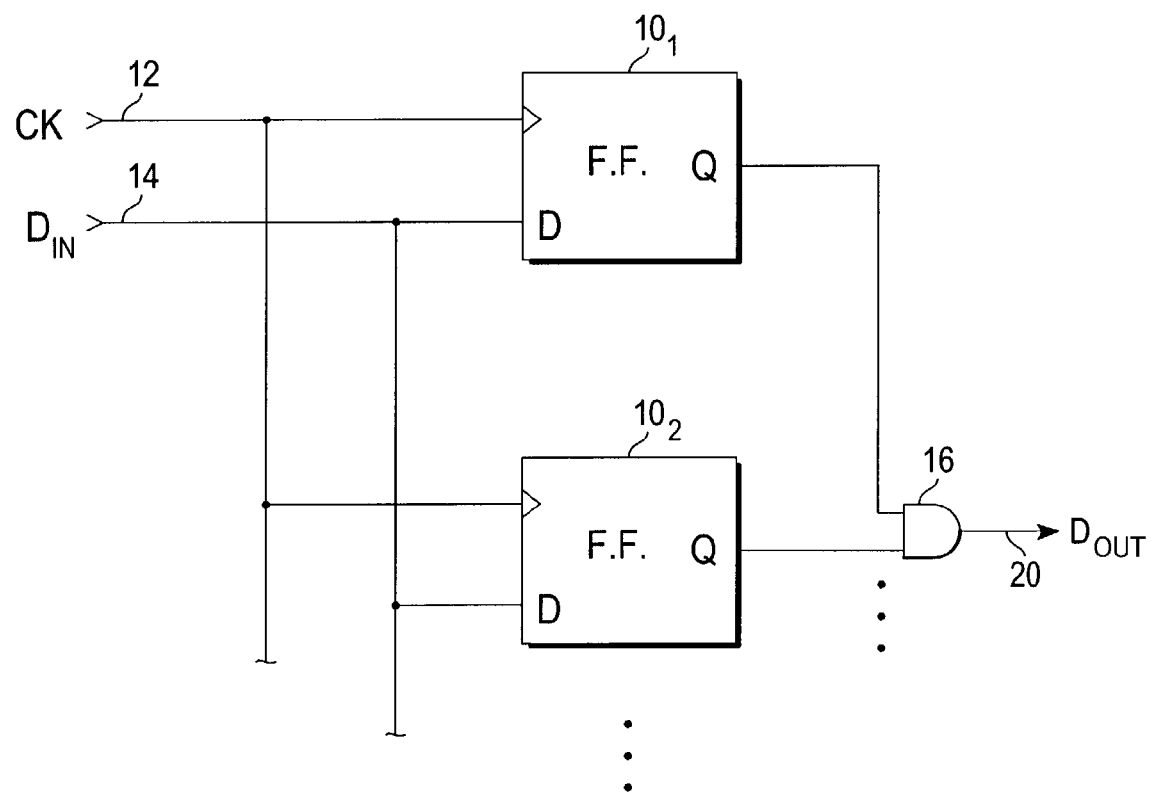
FIGURE

FAULT TOLERANT DATA STORAGE CIRCUIT

TECHNICAL FIELD

The present invention relates data storage within integrated circuits and to insuring the integrity of the initial state of such data stores during start-up or reset, including at power-on and in standby mode whenever voltage supply noise is present.

BACKGROUND ART

Many integrated circuits include flip-flops or latches to help carry out various sequential logic functions. Also, static RAM can be used to configure the functionality of circuits. When the power to an integrated circuit is turned on, it is usually important for proper operation of the circuit that these storage elements assume a certain initial state and be correctly loaded with specified data before beginning any functional operations. If there is a problem in the start-up conditions, it is possible that the state of the storage elements may be flipped from their desired initial state, and incorrect data may be stored, which could cause errors in subsequent device operation. It is often difficult to know whether the storage elements have correctly assumed their desired initial state and that data has been loaded correctly, since functional errors in device operation can sometimes be rather subtle. It is desirable for at least some of these storage elements be tolerant of start-up condition problems and tolerant of voltage supply noise during device operation, so that they still output the correct value.

An objective of the present invention is to provide a data storage circuit that corrects commonly occurring errors in the initial states of an integrated circuit's storage elements during start-up before any circuit operations begin and during operation when there is voltage supply noise.

DISCLOSURE OF THE INVENTION

The above objective has been met by a fault tolerant data storage circuit having a plurality of storage elements, all clocked by a common clock signal and loaded from a common data input, where each storage element in the storage circuit is constructed so that they are predisposed to assume a specified initial state. The storage element outputs are all combined by a logic gate, such as an AND gate, whose output forms the overall data output of the storage circuit. Each storage element is therefore a redundant element for the others, whose states are polled by the logic gate.

If there is noise or fluctuations on any of the signal lines during start-up or operations that cause one or more of the storage elements to assume an erroneous state, the problem will be automatically corrected, because the logic gate output will only produce an incorrect data output value if all of the storage elements have been similar affected and all are in the wrong state. Here, start-up includes both a power-on period, and also a standby perod after the circuit has reached full power but before beginning any operations. The fault tolerant circuit continues to output the preferred initial state until the storage elements are forced into the opposite state by intentionally applying a data signal to the common data input line and loading that data into the storage elements.

BRIEF DESCRIPTION OF THE DRAWING

The Figure is a block circuit diagram of the preferred embodiment of the present invention.

BEST MODE OF CARRYING OUT THE INVENTION

With reference to the Figure, a data storage circuit in accord to the present invention has two or more flip-flops $10_1$, $10_2$, etc. Other storage elements, such as latches or SRAM cells, could be used in place of the flip-flops.

An important characteristic of the storage elements is that they are constructed to assume a preferred state upon power-up and before beginning any functional operations of the integrated circuit. It is well known in the art how to accomplish this for each of the above-mentioned storage element types. For example, in the case of the flip-flops shown here, which are well known to comprise cross-coupled pairs of inverters, the inverter pull-up and pull-down transistors can be relatively sized to favor a zero output state for the flip-flop with substantially greater than 50% probability (e.g., 90%) under normal power-up conditions. However, they can assume an opposite state under abnormal power-up or standby conditions, such as when there is noise or fluctuations on one or more of the signal input lines of the storage elements.

Each of the storage elements $10_1$, $10_2$, etc. has a clock input, a data input and a data output. They might also have a reset input, not shown. The clock inputs of all storage elements are connected to a common clock line 12 receiving a clock signal CK. The data inputs of all storage elements are likewise connected to a common data input line 14 receiving a data input signal $D_{IN}$ after the initial power-on. Any other inputs, such as a reset signal, may likewise be received in common by all of the storage elements.

The outputs Q of all of the storage elements $10_1$, $10_2$, etc. are connected to respective inputs of an AND logic gate 16 (which can be constructed with a NAND gate and inverter). The AND logic gate 16 outputs a zero logic value, unless all inputs are at a one logic value. If the storage elements are constructed to favor a zero initial value, then unless all storage elements in the storage circuit flip to a one logic value, the logic gate output 20 will be a zero.

Assuming each flip-flop state is independently affected by abnormal conditions, one that has only a 10% chance of erroneously flipping to a one state under such conditions means that two flip-flops have only a 1% of both flipping to the one state, and three flip-flops have only a 0.1% chance of all flipping, etc. Each flip-flop serves as a redundant storage element for the others, assuring the desired initial output. The number of storage elements (flip-flops, latches, SRAM cells, etc.) in a storage circuit is a trade-off between the benefits of redundant error correction in the start-up sequence and the extra space and power requirements of each additional storage element. Typically, two flip-flops per storage circuit will be sufficient.

Note that power-on preference is a "weak" analog preference that is operative for defining an initial state of the storage element as the power supply voltage ramps up to it normal operating voltage. When data is subsequently written, the writing overpowers the initial preference of the storage elements, as writing is a digital process. The present invention is useful during stand-by and other non-writing modes to assure integrity in the memory states.

The invention claimed is:

1. A fault tolerant data storage circuit, comprising:

a plurality of storage elements, said storage elements having transistors sized to assume a preferred initial state upon power up and before beginning functional operations, each storage element having a clock input, a data input and a data output, the clock inputs of all of said storage elements being connected to a common clock signal line, the data inputs of all of said storage elements being connected to a common data input line of the data storage circuit; and a logic gate having a set of inputs connected to respective data outputs of all of said storage elements and having an output corresponding to said preferred initial state of storage elements until said elements are changed by an applied signal on said common data input line.

2. The circuit of claim 1 wherein the logic gate is a AND gate.

3. The circuit of claim 1 wherein said storage elements are selected from the group consisting of flip-flops, latches, and RAM cells.

4. The circuit of claim 1 wherein the number of storage elements is two.

5. A fault tolerant data storage circuit, comprising:

a pair of flip-flops, both flip-flops having transistors sized to assume a preferred initial state upon power up and before beginning functional operations, both flip-flops having a clock input, a data input and a data output, the clock inputs of both flip-flops connected to a common clock signal line, the data inputs of both flip-flops connected to a common data input line of the data storage circuit; and a logic gate having a pair of inputs connected to data outputs of both flip-flops and having an output.

6. The circuit of claim 5 wherein the logic gate is a AND gate.

* * * * *